US009832918B2

(12) United States Patent
Durant et al.

(10) Patent No.: US 9,832,918 B2
(45) Date of Patent: Nov. 28, 2017

(54) EMR ABSORBING SERVER VENT

(71) Applicant: Arc Technologies, Inc., Amesbury, MA (US)

(72) Inventors: Todd Durant, Hampstead, NH (US); Noel Bolduc, Hooksett, NH (US)

(73) Assignee: Arc Technologies, Inc., Amesbury, MA (US)

( * ) Notice: Subject to any disclaimer, the term of this patent is extended or adjusted under 35 U.S.C. 154(b) by 100 days.

(21) Appl. No.: 14/828,173

(22) Filed: Aug. 17, 2015

(65) Prior Publication Data
US 2017/0049011 A1 Feb. 16, 2017

Related U.S. Application Data

(60) Provisional application No. 62/204,814, filed on Aug. 13, 2015.

(51) Int. Cl.
| | | |
|---|---|---|
| *H05K 9/00* | (2006.01) | |
| *H05K 7/20* | (2006.01) | |
| *H05K 5/02* | (2006.01) | |
| *H05K 5/03* | (2006.01) | |

(52) U.S. Cl.
CPC ......... *H05K 9/0081* (2013.01); *H05K 5/0213* (2013.01); *H05K 5/0247* (2013.01); *H05K 5/03* (2013.01); *H05K 7/20727* (2013.01); *H05K 9/0041* (2013.01)

(58) Field of Classification Search
CPC .. H05K 9/0081; H05K 9/0041; H05K 5/0213; H05K 5/0247; H05K 5/03; H05K 5/04
See application file for complete search history.

(56) References Cited

U.S. PATENT DOCUMENTS

| | | |
|---|---|---|
| 3,551,017 A | 12/1970 | Iwasaki et al. |
| 4,003,840 A | 1/1977 | Ishino et al. |
| 5,366,664 A | 11/1994 | Varadan et al. |

(Continued)

FOREIGN PATENT DOCUMENTS

| | | |
|---|---|---|
| EP | 0243162 A2 | 10/1987 |
| EP | 0742095 A2 | 11/1996 |

(Continued)

OTHER PUBLICATIONS

Yang, et al; Novel Carbon Nanotube-Polystyrene Foam Composites for Electromagnetic Interference Shielding. Nano Letters. Nov. 2005;5(11):2131-2134.

(Continued)

*Primary Examiner* — Daniel J Rohrhoff
(74) *Attorney, Agent, or Firm* — Reza Mollaaghababa; Thomas Engellenner; Pepper Hamilton LLP

(57) ABSTRACT

In one aspect, a vent for use in an electronic device for absorbing electromagnetic radiation is disclosed, which includes a body comprising at least one thermoplastic polymer and a radiation-absorbing filler distributed within said thermoplastic polymer for absorbing electromagnetic radiation, said body further comprising a plurality of openings. The body is adapted for coupling to a frame of an electronic device to absorb electromagnetic radiation and to allow heat transfer via air flow through said openings between an interior of the frame and an external environment.

23 Claims, 5 Drawing Sheets

(56) References Cited

U.S. PATENT DOCUMENTS

| | | | |
|---|---|---|---|
| 5,488,371 A | 1/1996 | Targove | |
| 6,211,458 B1* | 4/2001 | Mitchell | H05K 9/0041 174/383 |
| 6,426,459 B1* | 7/2002 | Mitchell | H05K 9/0041 174/382 |
| 6,610,922 B1* | 8/2003 | Twiss | H05K 9/0041 174/390 |
| 6,870,092 B2* | 3/2005 | Lambert | H05K 9/0041 174/355 |
| 6,954,309 B2 | 10/2005 | Knobloch et al. | |
| 7,038,124 B1* | 5/2006 | Sosnowski | H05K 9/0041 174/377 |
| 7,280,009 B2 | 10/2007 | Reynolds et al. | |
| 7,492,610 B2* | 2/2009 | Gilliland | H05K 9/0041 174/350 |
| 7,733,646 B2* | 6/2010 | Hisatsune | H05K 7/20172 174/383 |
| 2003/0213606 A1* | 11/2003 | Casper | H05K 9/0041 174/360 |
| 2006/0086520 A1* | 4/2006 | Romano | H05K 9/0041 174/391 |
| 2016/0250688 A1* | 9/2016 | Coppola | G06Q 30/0269 419/53 |

FOREIGN PATENT DOCUMENTS

| | | |
|---|---|---|
| EP | 0975207 A2 | 1/2000 |
| FR | 2795873 A1 | 1/2001 |
| JP | 2004-502978 A | 1/2004 |
| JP | 2005158960 A | 6/2005 |
| WO | 2014099187 A1 | 6/2014 |

OTHER PUBLICATIONS

Yang, et al; The fabrication and electrical properties of carbon nanofibre-polystyrene composites. Nanotechnology. 2004 vol. 15, 1545-1548.

International Search Report and Written Opinion for related application PCT/US2013/073993, dated Jul. 18, 2014; 10 pages.

International Search Report and Written Opinion for corresponding application No. PCT/US2016/046787, dated Nov. 11, 2016; 12 pages.

Korean Office Action (English Translation) for corresponding Korean Application No. 10-2016-7015698, dated Apr. 27, 2017, pp. 1-10.

\* cited by examiner

EMR ABSORBING SERVER VENT

CROSS-REFERENCE TO RELATED APPLICATIONS

The present application claims benefit to Provisional Application No. 62/204,814, filed Aug. 13, 2015, which is herein incorporated by reference in its entirety.

BACKGROUND

The present invention is generally directed to radiation-absorbing vents for use in an electronic device, e.g., a computer server.

The operation of many electronic devices, such as computer servers, can result in generation of electromagnetic radiation as well as heat by their circuitry. The leakage of such electromagnetic radiation from the enclosure of such a device to the external environment can interfere with the operation of other nearby devices. Further, the heat generated by the circuitry of an electronic device needs to be removed from its enclosure to ensure proper operation.

One conventional solution is to couple metallic vents to the frame of the electronic device. Such vents can provide openings for air flow between the enclosure and the external environment for thermal management. Moreover metallic vents may reflect interfering electromagnetic radiation back into the enclosure. Such conventional solutions, however, present a number of shortcomings. For example, electromagnetic radiation at certain frequencies may penetrate through such vents and cause interference with other electronic devices.

Accordingly, there is a need for improved vents for use with electronic devices, and particularly computer servers.

SUMMARY

In one aspect, a vent for use in an electronic device for absorbing electromagnetic radiation (EMR) is disclosed, which includes a body comprising at least one thermoplastic polymer and a radiation-absorbing filler distributed within the thermoplastic polymer for absorbing electromagnetic radiation, said body further comprising a plurality of openings. The body is adapted for coupling to a frame of an electronic device to absorb electromagnetic radiation and to allow heat transfer via air flow through its openings between an interior of the frame and an external environment.

The thermoplastic polymer can include any of a polycarbonate, ABS (acrylonitrile butadiene styrene), polypropylene, polystyrene, polyamide, polyester, polyetherimide, liquid crystal polymer, or polyphenylene sulfide.

The concentration of the thermoplastic polymer can be in a range of about 50 percent to about 99.8 percent by volume. By way of example, in some embodiments, the concentration of the thermoplastic polymer is in a range of about 50 percent to about 95 percent, or in a range of about 55 percent to about 90 percent, or in a range of about 60 percent to about 85 percent, or in a range of about 65 percent to about 80 percent.

The radiation-absorbing filler can include a dielectric material exhibiting an absorptance greater than about 45 $m^{-1}$, e.g., in a range of about 45 $m^{-1}$ to about 9000 $m^{-1}$, for radiation frequencies in a range of about 1 gigahertz (GHz) to about 110 GHz, e.g., in a range of about 1 GHz to about 40 GHz. In some embodiments, the dielectric material can have a bulk dielectric constant in range of about 1 to about 150. Some examples of suitable radiation-absorbing fillers include carbon black, carbon fiber, graphene, or a combination thereof.

The concentration of the radiation-absorbing filler in the body of the vent can be, for example, in a range of about 0.2 percent to about 50 percent by volume. For example, in some embodiments, the concentration of the radiation-absorbing filler by volume can be in a range of about 0.5 percent to about 45 percent, or in a range of about 1 percent to about 40 percent, or in a range of about 2 percent to about 30 percent, or in a range of about 3 percent to about 20 percent, or in a range of about 5 percent to about 15 percent. In some embodiments, the concentration of the radiation-absorbing filler by volume is in a range of about 15 percent to about 40 percent.

In some embodiments, the radiation-absorbing filler can be in the form of a plurality of particles having a maximum size, e.g., in a range of about 1 micrometer (micron) to about 100 microns.

The openings distributed throughout the body of the vent can have a variety of different shapes. Some examples include, without limitation, hexagonal, circular, square or rectangular shapes. In some embodiments, the openings exhibit a maximum size in a range of about 0.045 inches (about 1.14 millimeters (mm)) to about 5 inches (about 127 mm) for each dimension (e.g., dimensions along x, y, and z axes of a Cartesian coordinate). For example, in some embodiments, the maximum size of the dimensions of the openings can be in a range of about 1.5 mm to about 120 mm, or in a range of about 2 mm to about 100 mm, or in a range of about 3 mm to about 90 mm, or in a range of about 4 mm to about 80 mm, or in a range of about 5 mm to about 70 mm.

In some embodiments, the vent can exhibit an insertion loss greater than about 5 dB for one or more radiation frequencies (or all the frequencies) in a range of about 1 GHz to about 40 GHz. For example, the vent can exhibit an insertion loss in a range of about 5 dB to about 35 dB for one or more radiation frequencies (or all the frequencies) in a range of about 1 GHz to about 40 GHz.

In some embodiments, a flame retardant additive is distributed throughout the body of the vent. By way of example, the flame retardant additive can include any of aluminum trihydrate, aluminum hydroxide, magnesium hydroxide, antimony oxides, ammonium polyphosphate or other organo phosphorus compounds, chlorinated compounds, or brominated compounds. Some examples of suitable chlorinated compounds include, without limitation, chlorinated paraffin oils such as Paroil and Chloroflo. An example of suitable brominated compounds include, without limitation, decabromodiphenyl oxide (DBDPO).

The concentration of the flame retardant additive can be, for example, in a range of about 0.05 percent to about 50 percent by volume, such as, in a range of about 2 percent to about 40 percent, or about 5 percent to about 30 percent, or about 10 percent to about 20 percent by volume.

In a related aspect, a vent for use in an electronic device for absorbing electromagnetic radiation is disclosed, which includes a body comprising at least one thermoplastic polymer and a radiation-absorbing filler distributed throughout the thermoplastic polymer for absorbing electromagnetic radiation. A plurality of openings are distributed throughout the body, e.g., randomly or according to a regular pattern. Further, a flame retardant additive is distributed throughout the thermoplastic polymer. A variety of radiation-absorbing fillers and flame retardant additives, such as those described above, can be employed.

In some embodiments, the concentration of the radiation absorbing filler can be greater than about 15 percent by weight, e.g., in a range of about 15 percent to about 50 percent, and the concentration of the flame retardant additive can be in a range of about 10 percent to about 40 percent by weight.

In another aspect, a computer enclosure is disclosed, which comprises a frame for housing a plurality of electronic components, and a vent adapted for coupling to the frame for absorbing electromagnetic radiation, where the vent includes a body comprising at least one thermoplastic polymer and a radiation-absorbing filler distributed within said thermoplastic polymer for absorbing electromagnetic radiation. The body further comprises a plurality of openings. The body is adapted to absorb electromagnetic radiation and to allow heat transfer via air flow through the openings between an interior of the frame and an external environment. The computer enclosure can include a variety of electronic components, such as, a central processing unit (CPU), memory modules, etc. In some embodiments, a fan disposed in the enclosure can facilitate the flow of air through the openings of the vent.

In some embodiments, the vent is capable of absorbing electromagnetic radiation generated by one or more of said electronic components. For example, the vent can be capable of absorbing electromagnetic radiation having a frequency in a range of about 1 GHz to about 110 GHz. In some embodiments, the vent exhibits an insertion loss greater than about 5 dB, e.g., an insertion loss in a range of about 5 dB to about 35 dB, for radiation frequencies in a range of about 1 GHz to about 40 GHz.

In some embodiments, in addition to the radiation-absorbing filler, a flame retardant additive is distributed within the thermoplastic polymer.

A variety of thermoplastic polymers, radiation-absorbing fillers, and flame retardant additives can be employed. By way of example, the thermoplastic polymer can be any of a polycarbonate, ABS, polypropylene, polystyrene, polyamide, polyester, polyetherimide, liquid crystal polymer, or polyphenylene sulfide. The radiation-absorbing filler can be formed of any suitable dielectric material. By way of example, any of carbon black, carbon fiber, and graphene can be employed.

The concentration of the thermoplastic polymer, the radiation-absorbing filler and the flame retardant additive can be in the ranges discussed above. By way of example, the concentration of the thermoplastic polymer can be in a range of about 50 percent to about 99.8 percent by volume, or any sub-range within this range. The concentration of the radiation-absorbing filler can be in a range of about 0.2 percent to about 50 percent by volume, or any sub-range within this range. And the concentration of the flame retardant additive can be in a range of about 0.1 to about 50 percent by volume, e.g., in a range of about 0.5 percent to about 45 percent, or in a range of about 1 percent to about 40 percent, or in a range of about 2 percent to about 35 percent, or in a range of about 2.5 percent to about 30 percent, or in a range of about 3 percent to about 25 percent, or in a range of about 4 percent to about 20 percent, or in a range of about 5 percent to about 15 percent.

Further understanding of various aspects of the present teachings can be obtained by reference to the following detailed description in conjunction with the associated drawings, which are described briefly below.

DETAILED DESCRIPTION

The present invention is generally directed to a vent for use with an electronic device, such as a computer server. The vent includes a porous polymeric body in which a radiation-absorbing filler is distributed. In some embodiments, the filler can absorb electromagnetic radiation at one or more frequencies in a range of about 1 GHz to about 110 GHz. Further, in some embodiments, a flame retardant additive is distributed within the polymeric body. The combination of the flame retardant additive and the radiation-absorbing filler can provide unexpected advantages. For example, it can help maintain the rigidity of the polymeric body for high concentrations of the radiation-absorbing filler, e.g., for concentrations of the filler greater than about 15% by weight.

The term "thermoplastic polymer" is known in the art and is used herein consistent with its common usage. To the extent that any additional explanation may be needed, a thermoplastic polymer is a polymer (i.e., a substance having a molecular structure consisting mainly or entirely of identical units bonded together, e.g., via covalent bonds) that becomes pliable or moldable above a temperature threshold and solidifies upon cooling.

The terms "absorptance" and "absorptance coefficient" are used herein interchangeably and consistent with common usage in the art to refer to the attenuation of the intensity of electromagnetic radiation passing through a length (z) of the medium in accordance with the following relation:

$$I_z = I_0 e^{-\alpha z} \quad \text{Equation (1)}$$

wherein, $I_0$ denotes the initial intensity of the electromagnetic radiation, $I_z$ denotes the intensity of the electromagnetic radiation after passage through a length (z) of the medium, and $\alpha$ denotes the absorptance coefficient.

Further, the ratio of $I_z$ and $I_0$, i.e., $$\frac{I_z}{I_0},$$

can be considered as the insertion loss of the medium.

The term "about" is used herein to indicate a variation of at most 5% about a numerical value.

Figure 1:
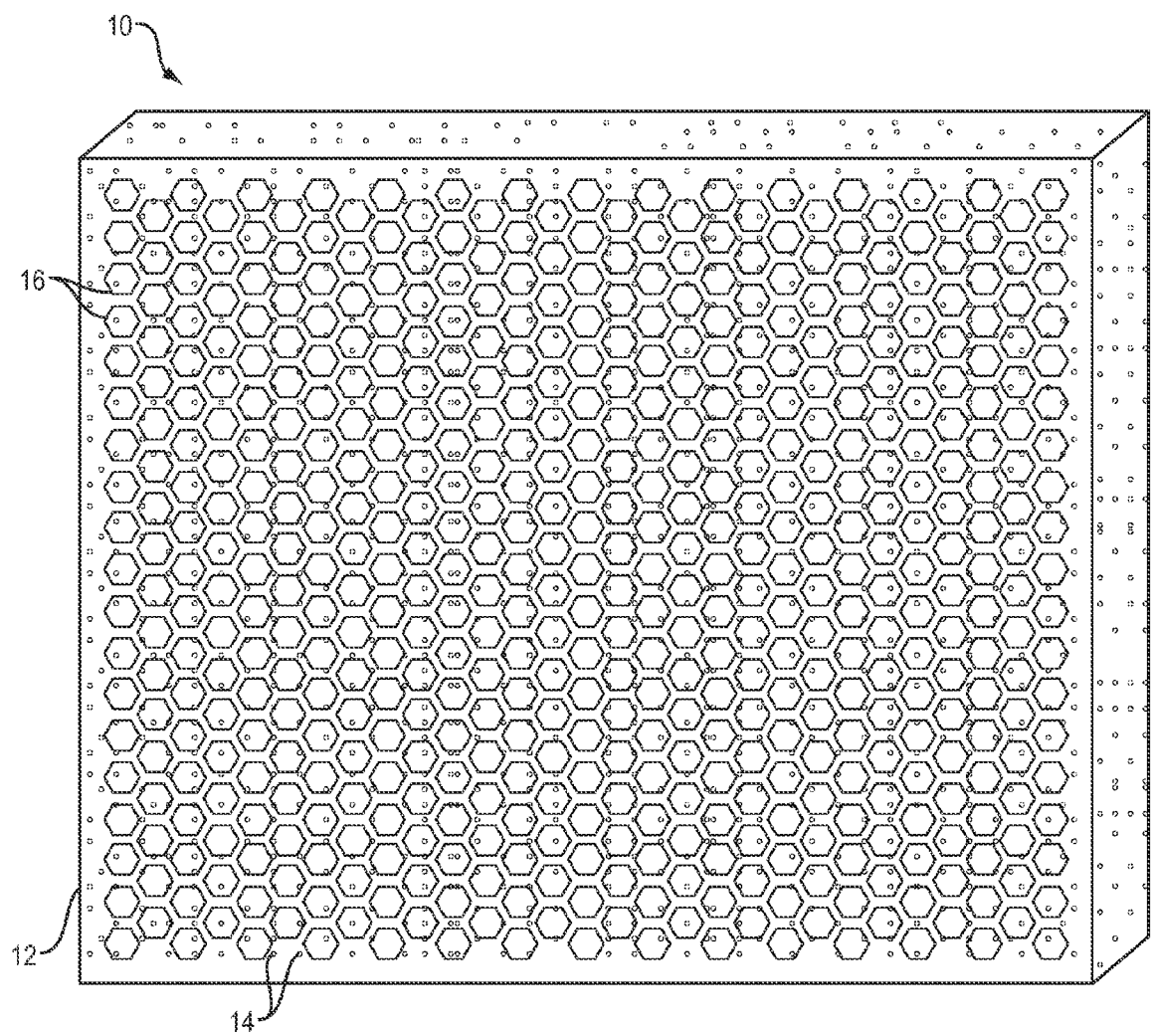
FIG. 1 schematically depicts a vent according to an embodiment of the present teachings, FIG. 2 schematic depicts a vent according to another embodiment of the present teachings, FIG. 3 schematically depict an enclosure of an electronic device, e.g., a computer server, having a frame in which a vent according to an embodiment of the present teachings is incorporated, FIGS. 4A and 4B schematically depict another example of a vent according to an embodiment of the present teachings coupled to the frame of a computer server.

FIG. 1 schematically depicts a vent 10 according to an embodiment of the present teachings for use in an electronic device for absorbing electromagnetic radiation. The vent 10 includes a body 12 that comprises at least one thermoplastic polymer and a radiation-absorbing filler 14 that is distributed within the thermoplastic polymer for absorbing electromagnetic radiation. As discussed in more detail below, in some embodiments, the body 12 can further include one or more flame retardant additives.

A variety of thermoplastic polymers can be employed as a constituent of the body 12. By way of example and without any limitation, the thermoplastic polymer can be any of a polycarbonate, ABS (acrylonitrile butadiene styrene), polypropylene, polystyrene, polyamide, polyester, polyetherimide, liquid crystal polymer, or polyphenylene sulfide.

In some embodiments, the thermoplastic polymer can constitute about 50 percent to about 99.8 percent of the volume of the body 12. By way of example, in some embodiments, the concentration of the thermoplastic polymer in the body 12 can be in a range of about 50 percent to about 90 percent, or in a range of about 60 percent to about 85 percent, or in a range of about 65 percent to about 80 percent, or in a range of about 70 percent of about 95 percent by volume of the body 12.

The radiation-absorbing filler 14 can be formed of a dielectric material that exhibits a suitable high coefficient of absorptance for at least one radiation wavelength in a range of about 1 GHz to about 110 GHz. By way of example, the radiation-absorbing filler 14 can be a material having a bulk dielectric constant in a range of about 1 to about 150 and an absorptance coefficient in a range of about 45 $m^{-1}$ to about 9000 $m^{-1}$ for one or more frequencies in the range of about 1 GHz to about 110 GHz.

In some embodiments, the vent 10 can have a thickness (T) in a range of about 0.1 inches (2.54 mm) to about 5 inches (50.8 mm). In some such embodiments, the concentration of the radiation-absorbing filler and the thickness of the vent 10 can be selected such that the vent would exhibit an insertion loss in a range of about −5 dB to about −35 dB.

Some examples of suitable radiation-absorbing fillers include, without limitation, carbon black, carbon fiber, and graphene. In some embodiments, the filler is present in the body 12 of the vent at a concentration in a range of about 0.2 percent to about 50 percent by volume. For example, the volume concentration of the filler can be in a range of about 1 percent to about 50 percent, or about 1 percent to about 45 percent, or about 5 percent to about 35 percent, or about 10 percent to about 30 percent, or about 20 percent to about 40 percent.

In some embodiments, the radiation-absorbing filler is in the form of a plurality of particles having a maximum size in a range of about 1 micron to about 100 microns.

With continued reference to FIG. 1, the vent 10 can further include a plurality of openings 16 distributed throughout the body 12. While in some embodiments, the openings 16 are arranged according to a predefined geometrical array, in other embodiments the openings 16 can be randomly distributed. As discussed in more detail below, once the vent 12 is coupled to the frame of an electronic device, e.g., a computer server, the openings 16 allow for a flow of air between the interior of the electronic device and an external environment to facilitate removing heat from the interior of the device, and in some cases from the vent 10 itself. Again, as discussed in more detail below, in some cases, one or more fans are employed to facilitate such air flow between the interior of the electronic device and the external environment.

The openings 16 can have a variety of different shapes, such as, hexagonal, circular, square, rectangle, or a non-geometric shape. In some embodiments, the size of the openings are chosen such that the vent 10 can provide adequate absorption of electromagnetic radiation, e.g., radiation generated from electronic components within an enclosure of the electronic device or external radiation incident on the device, while allowing a sufficient air flow therethrough for removing heat from the interior of the device. For example, in some embodiments, a maximum size of each dimension of the openings (e.g., x, y, and z dimensions in a Cartesian coordinate) is in a range of about 0.045 inches (about 1.14 millimeters (mm)) to about 5 inches (about 127 millimeters). For example, in some embodiments, the maximum size of the dimensions of the openings can be in a range of about 1.5 mm to about 120 mm, or in a range of about 2 mm to about 100 mm, or in a range of about 3 mm to about 90 mm, or in a range of about 4 mm to about 80 mm, or in a range of about 5 mm to about 70 mm. In this illustrative embodiment, the openings have a hexagonal shape with a maximum dimensional size in a range of about 1.14 mm to about 127 mm, or any of the other ranges recited above. In other embodiments, the openings can be circle-shaped with a diameter in the above ranges.

Figure 2:
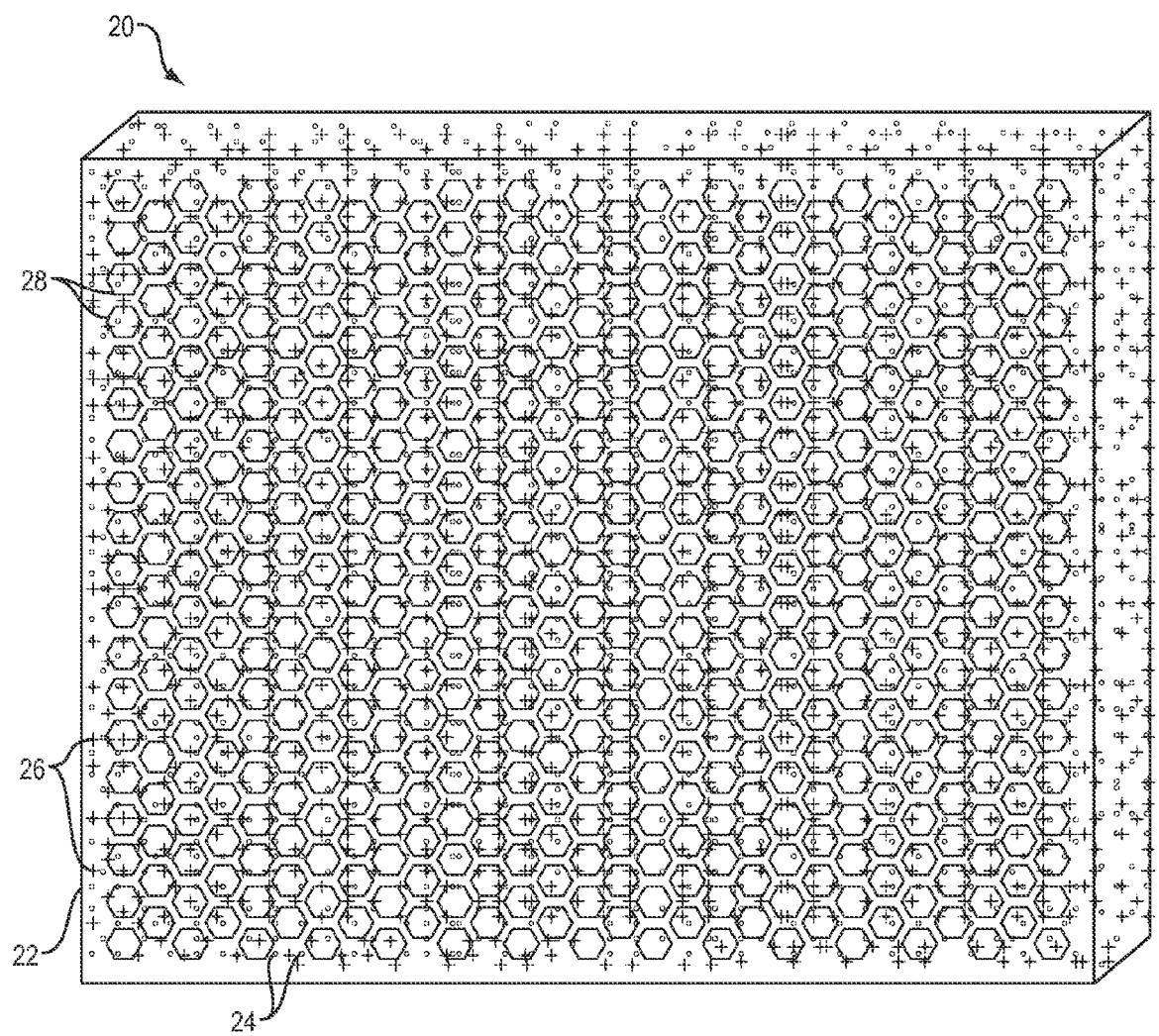

In some embodiments, a vent according to the present teachings can include a thermoplastic material, a radiation-absorbing filler as well as a flame retardant additive. By way of example, FIG. 2 schematically depicts a vent 20 according to such an embodiment that includes a body 22 comprising a thermoplastic polymer, such as one or more of the thermoplastic polymers listed above, and a radiation-absorbing filler 24, such as one or more of the fillers listed above. In addition, a flame retardant additive 26 is distributed throughout the body 12. Similar to the vent 10, vent 20 includes a plurality of holes 28 distributed through its body 22 to allow flow of air therethrough.

The concentration of the flame retardant additive can be, for example, in a range of about 0.1 to about 50 percent by volume, e.g., in a range of about 0.5 percent to about 45 percent, or in a range of about 1 percent to about 40 percent, or in a range of about 2 percent to about 35 percent, or in a range of about 2.5 percent to about 30 percent, or in a range of about 3 percent to about 25 percent, or in a range of about 4 percent to about 20 percent, or in a range of about 5 percent to about 15 percent.

Some examples of suitable flame retardant additives include, without limitation, aluminum trihydrate, aluminum hydroxide, magnesium hydroxide, antimony oxides, ammonium polyphosphate or other organo phosphorus compounds, chlorinated compounds, or brominated compounds. Some examples of suitable chlorinated compounds include, without limitation, chlorinated paraffin oils such as Paroil and Chloroflo. An example of suitable brominated compounds include, without limitation, decabromodiphenyl oxide (DBDPO).

The incorporation of a flame retardant additive as a constituent of the body 12 provides a number of advantages. For example, the flame retardant additive can improve structural rigidity of the vent.

In some embodiments, the use of the flame retardant additive can allow incorporating a higher concentration of the radiation-absorbing filler in the body 12 while ensuring that the body 12 exhibits sufficient structural rigidity. For example, the use of a flame retardant additive, such as those listed above, can allow incorporating the radiation-absorbing filler at a volume concentration of equal to or greater than about 15 percent in the body 12 while ensuring that the body 12 is sufficiently rigid for its intended applications (e.g., as a vent in a computer server). In some embodiments, body 12 contains a concentration of the radiation-absorbing filler in a range of about 15% to about 50% by weight and a concentration of the flame retardant additive in a range of about 20% to about 50% by weight. In such embodiments, the unexpected synergy between the radiation-absorbing filler and the flame retardant additive results in a vent that provides significant absorption of the electromagnetic radiation, e.g., in a frequency range of about 1 GHz to about 110

GHz (corresponding to a wavelength range of about 300 mm to 3 mm) while exhibiting a desired structural rigidity.

Figure 3:
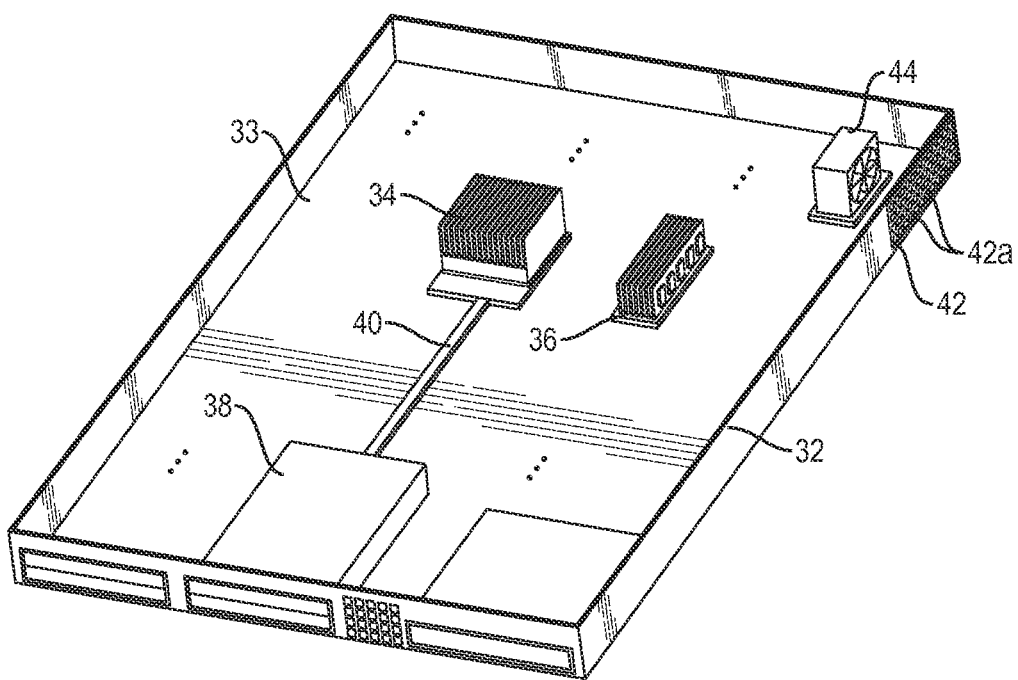

FIG. 3 schematically depicts a computer server 30 having a frame 32 that provides an enclosure 33 for housing a plurality of electronic components. By way of example and without limitation, the electronic components can include a central processing unit (CPU) 34, a plurality of random access memory (RAM) modules 36, a persistent memory module 38, a communication bus 40, among other components. A vent 42 according to the present teachings, such as the vents 10 or 20 described above, is coupled to the frame 32 to provide electromagnetic shielding, e.g., for electromagnetic radiation in a frequency range of about 1 GHz to about 110 GHz. In particular, the vent 42 can absorb electromagnetic radiation generated by the electronic components contained in the enclosure 33 to minimize, and preferably prevent, its leakage to the external environment. The coupling of the vent 42 to the frame can be achieved using any known method in the art, e.g., using glue, rivets, clamps, etc.

In addition, the vent 42 allows a flow of air, via a plurality of holes 42a distributed throughout the vent 42, between the enclosure 33 and the external environment. In this embodiment, a fan 44 disposed within the disclosure facilitates the air flow from inside the enclosure to the external environment via the holes provided in the vent 42. Such air flow advantageously provides cooling of the electronic components disposed within the enclosure 33.

Figure 4A:
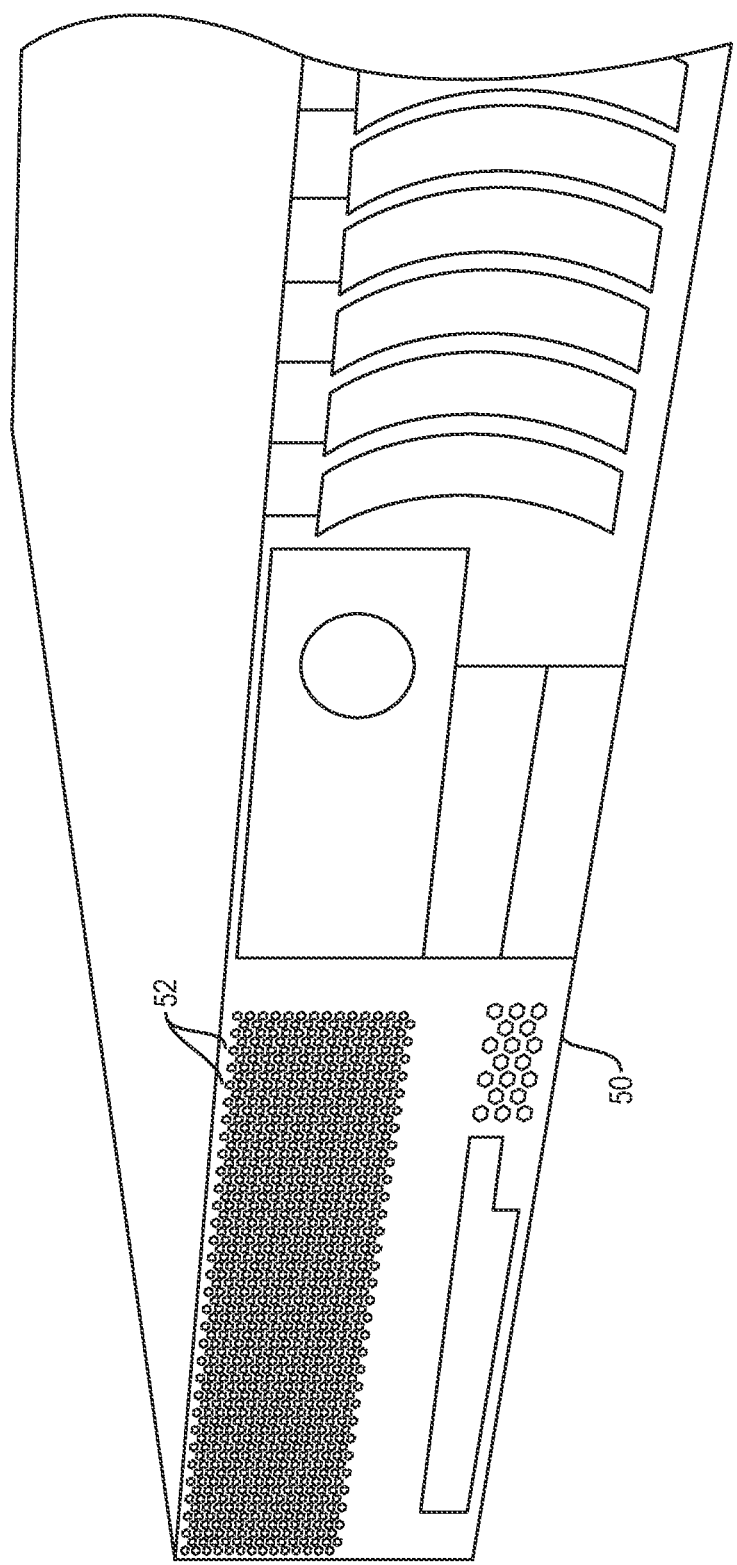
Figure 4B:
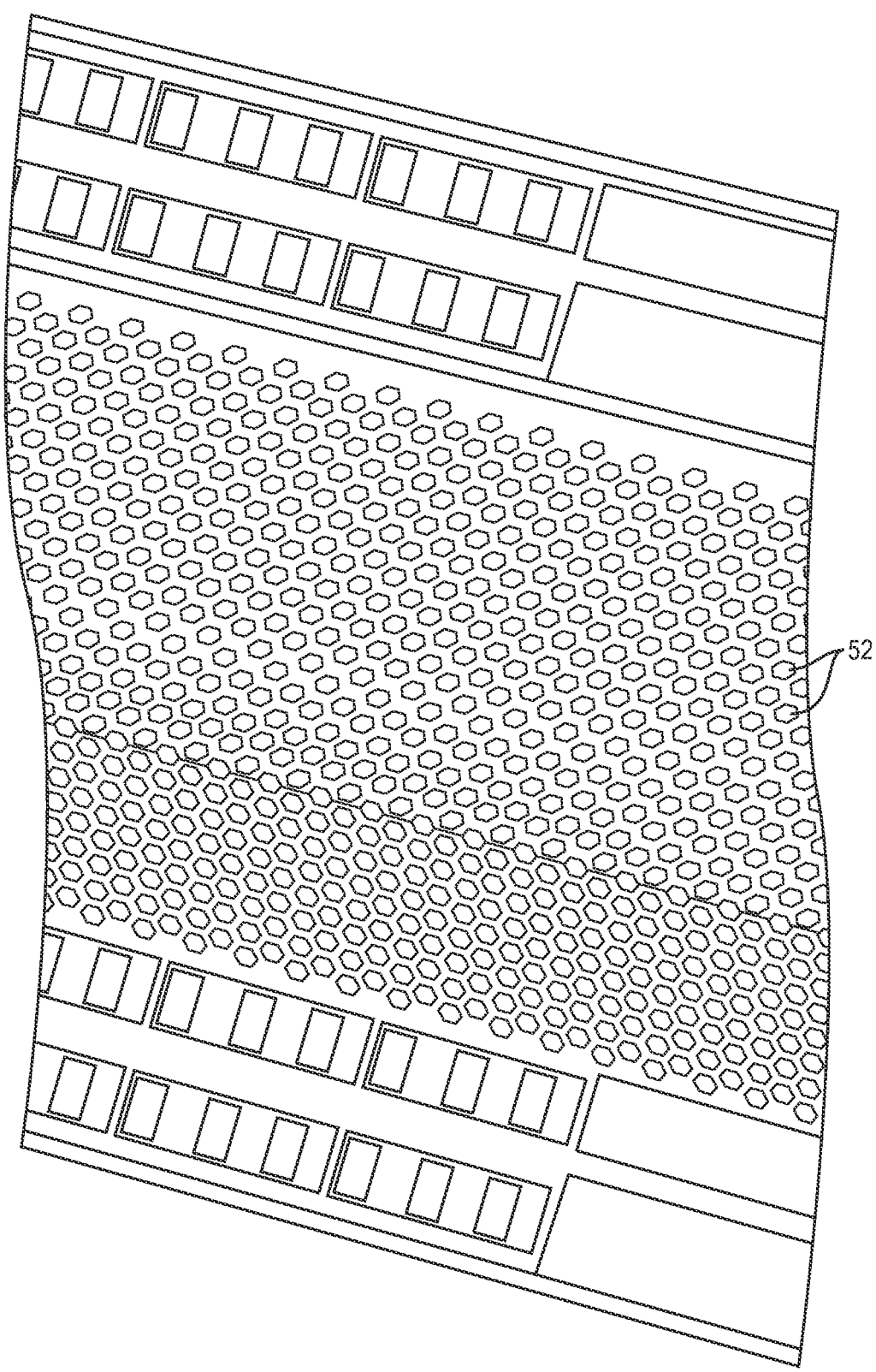

By way of further example, FIGS. 4A and 4B schematically show the frame of a computer server 50 to which a vent 52 according to the present teachings, such as the above vents, is coupled. As shown more clearly in FIG. 4B, the vent 52 includes a plurality of hexagonal openings (holes) distributed in a regular pattern to provide a honeycomb structure.

A variety of techniques can be employed to fabricate a vent according to the present teachings. For example, the radiation-absorbing filler and/or the flame retardant additive can be incorporated in a thermoplastic polymer by adding the filler and/or the additive to a molten quantity of thermoplastic polymer generated by heating a plurality of polymeric pellets to an elevated temperature. The polymeric mixture can then be extruded using multi-lumen tooling into a continuous length and later cut to desired thickness. The mixture could also be injection molded into a final geometric configuration that includes the through holes or a modular section that could be additively assembled with other such pieces to form the final configuration. Alternatively, solid block of material can be fabricated either by extrusion or injection molding and through holes can be added via secondary operations such and CNC machining, waterjet or laser-cutting.

The following example is provided for further elucidation of various aspects of the present teachings, and is not intended to provide necessarily the optimal ways of practicing the present teachings or the optimal results that can be achieved.

EXAMPLE

A part was fabricated by injection molding an absorber compound containing carbon black and polypropylene into a piece 6 in. long×6 in. wide×0.200 in. thick. Using a waterjet cutting process, an array of hexagonal holes measuring 6 mm across was drilled through the part to form a vent. The vent was tested electrically and insertion loss values for a number of frequencies were as follows:

TABLE 1

| Frequency (GHz) | Insertion Loss (dB) |
|---|---|
| 10 | −21.3 |
| 15 | −21.4 |
| 20 | −18.2 |
| 25 | −13.0 |
| 30 | −7.1 |
| 35 | −5.0 |
| 40 | −4.1 |

Those having ordinary skill in the art will appreciate that various changes can be made to the above embodiments without departing from the scope of the invention.

What is claimed is:

1. A vent for use in an electronic device for absorbing electromagnetic radiation, comprising:
   a body comprising at least one thermoplastic polymer and a radiation-absorbing filler distributed within said thermoplastic polymer for absorbing electromagnetic radiation, wherein said filler comprises any of carbon black, carbon fiber, and graphene,
   said body further comprising a plurality of openings,
   wherein said body is adapted for coupling to a frame of an electronic device to absorb electromagnetic radiation and to allow heat transfer via air flow through said openings between an interior of the frame and an external environment, and
   wherein the vent exhibits an insertion loss greater than about −5 dB for radiation frequencies in a range of about 1 GHz to about 110 GHz.

2. The vent of claim 1, wherein said thermoplastic polymer comprises any of a polycarbonate, ABS, polypropylene, polystyrene, polyamide, polyester, polyetherimide, liquid crystal polymer, or polyphenylene sulfide.

3. The vent of claim 1, wherein said filler exhibits an absorptance coefficient greater than 45 ml.

4. The vent of claim 1, wherein a concentration of said thermoplastic polymer is in a range of about 50 percent to about 99.8 percent by volume.

5. The vent of claim 1, wherein a concentration of said filler is in a range of about 0.2 percent to about 50 percent by volume.

6. The vent of claim 1, wherein said body further comprises a flame retardant additive.

7. The vent of claim 6, wherein said flame retardant additive comprises any of aluminum trihydrate, aluminum hydroxide, magnesium hydroxide, antimony oxides, ammonium polyphosphate or other organo phosphorus compounds, chlorinated compounds, or brominated compounds.

8. The vent of claim 6, wherein a concentration of said flame retardant additive is in a range of about 0.01 percent to about 50 percent by volume.

9. The vent of claim 1, wherein said openings have a largest dimension in a range of about 0.045 inches to about 5 inches.

10. The vent of claim 1, wherein said openings have a geometrical shape.

11. The vent of claim 10, wherein said geometrical shape is any of circular, hexagonal, square, and rectangular shape.

12. The vent of claim 1, wherein said vent exhibits an insertion loss in excess of about −5 dB for radiation frequencies in a range of about 1 GHz to about 40 GHz.

13. The vent of claim 12, wherein said vent exhibits an insertion loss in a range of about −5 dB to about −35 dB for radiation frequencies in a range of about 1 GHz to about 40 GHz.

14. The vent of claim 1, wherein said filler comprises a plurality of particles having a maximum size in a range of about 1 micron to about 100 microns.

15. A computer enclosure, comprising:
a frame for housing a plurality of electronic components,
a vent adapted for coupling to the frame for absorbing electromagnetic radiation, said vent comprising:
a body comprising at least one thermoplastic polymer and a radiation-absorbing filler distributed within said thermoplastic polymer for absorbing electromagnetic radiation, wherein said filler comprises any of carbon black, carbon fiber, and graphene,
said body further comprising a plurality of openings,
wherein said body is adapted to absorb electromagnetic radiation and to allow heat transfer via air flow through said openings between an interior of the frame and an external environment, and
wherein the vent exhibits an insertion loss greater than about −5 dB for radiation frequencies in a range of about 1 GHz to about 110 GHz.

16. The computer enclosure of claim 15, wherein said vent is adapted to absorb electromagnetic radiation generated by one or more of said electronic components.

17. The computer enclosure of claim 16, wherein said insertion loss is in a range of about −5 dB to about −35 dB.

18. The computer enclosure of claim 15, wherein said vent exhibits an insertion loss greater than about −5 dB for radiation frequencies in a range of about 1 GHz to about 40 GHz.

19. The computer enclosure of claim 15, wherein said thermoplastic polymer comprises any of a polycarbonate, ABS, polypropylene, polystyrene, polyamide, polyester, polyetherimide, liquid crystal polymer, or polyphenylene sulfide.

20. The computer enclosure of claim 15, wherein a concentration of said thermoplastic polymer in said vent is in a range of about 50 percent to about 99.8 percent by volume.

21. The computer enclosure of claim 15, wherein a concentration of said radiation-absorbing filler in said vent is in a range of about 0.2 percent to about 50 percent by volume.

22. The computer enclosure of claim 15, wherein said body further comprises a flame retardant additive.

23. The computer enclosure of claim 15, wherein at least one of said enclosed electronic components comprises a central processing unit (CPU).

\* \* \* \* \*